(12) United States Patent
Guldi

(10) Patent No.: US 6,488,037 B1
(45) Date of Patent: Dec. 3, 2002

(54) PROGRAMMABLE PHYSICAL ACTION DURING INTEGRATED CIRCUIT WAFER CLEANUP

(75) Inventor: Richard L. Guldi, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 157 days.

(21) Appl. No.: 09/640,637

(22) Filed: Aug. 17, 2000

Related U.S. Application Data

(60) Provisional application No. 60/151,708, filed on Aug. 31, 1999.

(51) Int. Cl.[7] .................................................. C25F 5/00
(52) U.S. Cl. ............................. 134/1.3; 134/2; 134/10; 134/16; 134/17; 134/18; 134/34; 134/37
(58) Field of Search ............................. 134/1.3, 18, 10, 134/37, 56 R, 57 R, 58 R, 102.1, 103.1, 109, 110, 113, 902, 34, 2, 16, 17

(56) References Cited

U.S. PATENT DOCUMENTS

| | | | | |
|---|---|---|---|---|
| 5,421,353 | A | * | 6/1995 | Jakubowski ............... 134/104.2 |
| 5,520,205 | A | * | 5/1996 | Guldi et al. ............... 134/102.1 |
| 5,551,165 | A | * | 9/1996 | Turner et al. ............... 134/902 |
| 5,698,040 | A | | 12/1997 | Guldi et al. ................. 134/1.3 |
| 5,849,091 | A | * | 12/1998 | Skrovan et al. ................. 134/1 |
| 6,250,161 | B1 | * | 6/2001 | Khuri-Yakub et al. ........ 73/627 |

* cited by examiner

Primary Examiner—Randy Gulakowski
Assistant Examiner—M. Kornakov
(74) Attorney, Agent, or Firm—Jacqueline J. Garner; Wade James Brady, III; Frederick J. Telecky, Jr.

(57) ABSTRACT

Wafer cleaning systems (10, 25) utilizing both chemical and physical action to clean integrated circuit wafers (14, 24) is disclosed. Chemical cleaning action is provided by liquid retained within a tank (2, 22), sized either to hold a single wafer (24) or a batch of wafers (14) held within a carrier (12). Physical action is provided in the wafer cleaning system either by way of inert gas bubbling through a baffle (5) or by way of ultrasonic energy applied by transducers (28) located in the tank (2, 22). The systems (10, 25) have a programmable controller (20, 30) for initiating the physical cleaning action after insertion of the wafers (14, 24) into the chemical bath, and for ceasing the physical action prior to removal of the wafers (14, 24). After a waiting time after the ceasing of the physical action, to calm the chemical bath and to permit any retained bubbles to escape to the atmosphere, the wafers (14, 24) may then be removed from the chemical bath, with reduced risk of staining and particle release. A recirculating pump (35) and filter (33) system may also be incorporated to clean the chemical bath; during such time as wafers are not present in the chemical bath, the programmable controller (20, 30) may initiate the physical action to assist in cleaning of the tank (2, 22).

12 Claims, 2 Drawing Sheets

PROGRAMMABLE PHYSICAL ACTION DURING INTEGRATED CIRCUIT WAFER CLEANUP

CROSS-REFERENCE TO RELATED APPLICATIONS

This application claims priority under 35 USC §119(e)(1) of provisional application No. 60/151,708 filed Aug. 31, 1999.

STATEMENT REGARDING FEDERALLY SPONSORED RESEARCH OR DEVELOPMENT

Not applicable.

BACKGROUND OF THE INVENTION

This invention is in the field of integrated circuit manufacture, and is more specifically directed to chemical bath integrated circuit wafer cleanup operations.

Chemical bath cleanup operations have been utilized in the manufacture of integrated circuits virtually since the inception of the field. Such cleanups are primarily useful in the removal of particulate and film-like residue that are generated as by products of various stages of the manufacturing process. In particular, chemical bath cleanups are typically used after a masked etch process to remove the masking material, typically photoresist, to remove any particulates or films that are generated as a result of the etch process itself, and also to remove metallic contaminants that can degrade device performance. Chemical bath cleanups are also used to remove native oxide films prior to the deposition (or thermal growth, in the case of a gate oxide) of a film, to promote adhesion of the new film to the underlying layer; such native oxides may be formed in previous processes, or even simply during the storage of the wafers in air between processes.

Typically, the chemical bath itself consists of a chemical solvent or reagent for the material to be removed. For solvent cleanup, the solvent may be a general-purpose solvent, such as deionized water, isopropyl alcohol, other organic solvents, and the like, for removing a wide range of residues that may be present. At other stages in the process requiring a reagent cleanup, a reagent will be specifically selected to remove a particular residue that is expected at a process station; examples of such cleanup reagents include dilute acid or base solutions (e.g., HF and $NH_4OH$). Additionally, a sequence of cleanups in different chemical baths may also be performed, with a final chemical bath of deionized water or IPA to remove residue from the previous cleanups.

In recent years, new materials have been used in the manufacture of integrated circuits, particularly in carrying out masked etch operations of sub-micron features. However, the residues of some of these new materials have been observed to be resistant to removal by way of chemical bath cleanups. Examples of these materials include photoresists responsive to "deep-UV" wavelengths of light exposure and new anti-reflective coatings that are applied below photoresist layers (so-called "bottom anti-reflective coatings", or "BARCs"), each of which have been observed to leave stubborn polymers behind after etch processes. Additionally, residues from modern highly active plasma etch chemistries have also been observed to be particularly persistent.

A conventional technique for improving the efficacy of chemical bath cleanup is to insert a physical action into the cleanup. One conventional example of such physical action is the injection of an inert gas, such as nitrogen, into the chemical bath to bubble the liquid; the bubbles of the injected gas provide a physical action in the chemical bath which can dislodge particulate and film residue from the wafer being cleaned. Another conventional approach applies ultrasonic energy to the chemical bath, resulting in a physical turbulence in the liquid that also dislodges such contaminants from the wafer. Such physical action has been observed to be quite effective in cleaning the integrated circuit wafers. Additionally, it is known that bubbling of the chemical bath can assist in keeping clean the walls of the tank containing the liquid chemical bath.

However, the physical action caused by the bubbling or ultrasonic energy has been observed to have detrimental effects on the eventual cleanup. In particular, the physical action produced by bubbling and ultrasonics causes turbulence at the surface of the bath, which has been observed to leave "water marks" on the surface of the wafer as the wafer is inserted into and removed from the chemical bath. The nature of these marks depends upon the process step and chemical bath that is used. One type of water mark is in the form of an oxide growth stain, such as has been especially prevalent following an etch of doped polysilicon; such stains can locally change the reflectivity of the wafer, thus causing an error in a subsequent photolithography operation. Such oxide stains can also locally retard a subsequent etch, particularly of highly selective etches commonly used in modem integrated circuit manufacture, often resulting in failed or resistive contacts. Another manifestation of such a water mark results from a bubble that remains on the surface of the wafer during cleanup and prevents the chemical bath cleanup from cleaning residue from the portion of the wafer under the bubble.

Particles have also been observed to be trapped at the wafer surface as a result of withdrawing the wafer from the chemical bath during bubbling. It has been observed that extremely small particles, generated from the edges of the wafers, tend to collect upon bubbles at the surface of the chemical bath. When a wafer is withdrawn from the chemical bath through these particle-bearing bubbles at the surface, the particles will be transferred to the surface of the wafer, providing localized contamination.

Heretofore, integrated circuit process engineers have been faced with the difficult choice of either eliminating the physical action of the chemical bath cleanup operations, by permanently turning off the gas bubbling or ultrasonic energy, or of simply living with a certain level of watermark staining and other defects.

By way of further background, U.S. Pat. No. 5,698,040, commonly assigned herewith and incorporated by reference hereinto, discloses a known wafer cleaner and operation of the same.

BRIEF SUMMARY OF THE INVENTION

It is therefore an object of the present invention to provide a chemical bath cleanup that utilizes physical action in combination with the chemical bath, while preventing watermark stains on the wafer upon insertion and removal.

It is a further object of the present invention to provide such a chemical bath cleanup that may be readily implementable into manufacturing process equipment.

It is a further object of the present invention to provide such a chemical bath cleanup apparatus that can use physical action to clean its chamber walls when no wafers are present.

It is a further object of the present invention to provide such a chemical bath cleanup apparatus in which the physical action enables a reduction in the cleanup time required.

Other objects and advantages of the present invention will be apparent to those of ordinary skill in the art having reference to the following specification together with its drawings.

The present invention may be implemented into a chemical bath cleanup, either a single wafer cleanup or a batch cleanup, by way of a programmable controller applied to the generation of physical action, such as a gas bubbler or ultrasonic transducer. The programmable controller is programmed to provide the physical action to the chemical bath while the wafers are present therewithin, and to then turn off the chemical bath for a waiting period prior to withdrawal of the wafers from the chemical bath. According to another aspect of the present invention, the programmable cleanup bath is programmed to generate the physical action for a selected time when no wafers are present therewithin. This operation is either programmed to occur periodically, or upon detection of a sufficient number of contaminants in the bath itself. The physical action assists in the self-cleaning of the sides of the bath vat.

DETAILED DESCRIPTION OF THE INVENTION

As will become apparent from the following description, the present invention may be embodied in various types of wafer cleaning systems, for cleaning integrated circuit wafers at various stages of the manufacturing process. Specifically, the present invention is useful in connection with batch wafer cleaning systems in which a group of wafers in a wafer carrier are simultaneously cleaned, as well as in connection with single wafer cleanup stations. Furthermore, the present invention is useful in connection with a wide range of cleanup functions including post-etch photoresist removal, pre-deposition native oxide removal, and the like; as such, the present invention is useful in connection with a wide range of chemical bath liquids, including solvents and reagents. It is therefore contemplated that those skilled in the art having reference to this specification will be readily able to utilize the present invention in connection with not only with the particular exemplary embodiments described herein, but also with other current and future types of wafer cleaning systems and processes while staying within the scope of the invention as hereinafter claimed.

Figure 1:
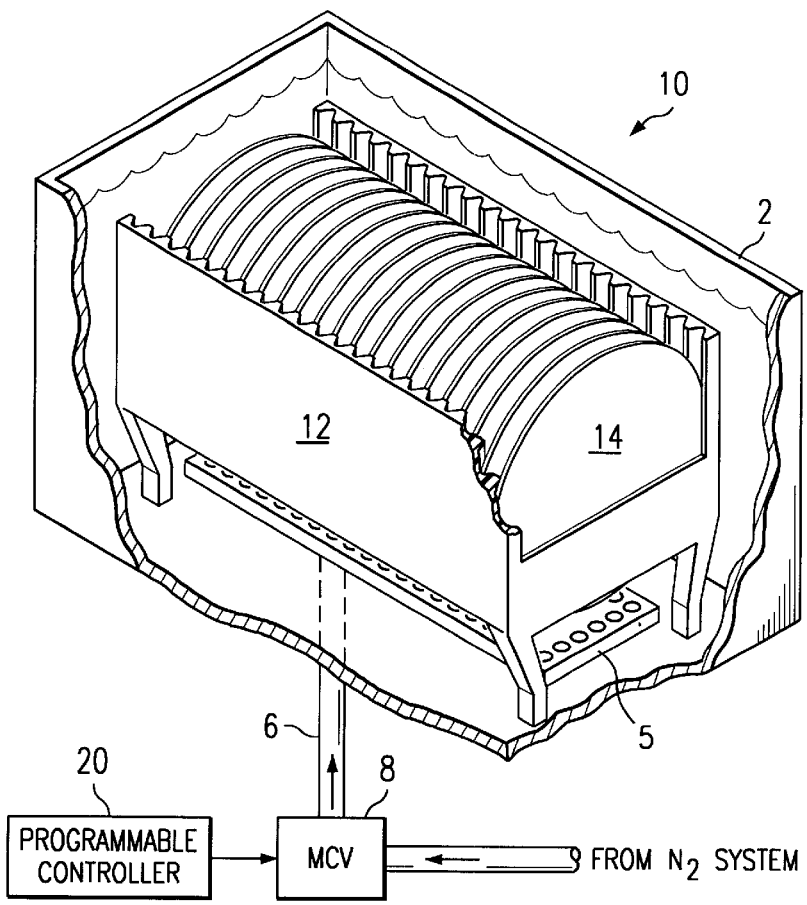
FIG. 1 is an isometric cutaway view in combination with a schematic diagram in block form of a wafer cleaning apparatus according to a first preferred embodiment of the present invention.

Referring to FIG. 1, batch wafer cleaning system 10 according to a first preferred embodiment of the present invention will now be described in detail. System 10 includes tank 2, which is an enclosure with an open top to permit the insertion and removal of wafers thereinto for cleaning. In this embodiment of the invention, wafers 14 are housed and transported in wafer carrier 12 as a lot or batch; as evident in FIG. 1, wafer carrier 12 is of conventional design, having slots for retaining wafers 14 therewithin in a spaced-apart manner relative to one another. For cleanup by system 10, both carrier 12 and wafers 14 are placed into and removed from tank 2, eliminating the need to remove (and replace) wafers 14 from carrier 12, and also permitting the cleanup of carrier 12 itself. Tank 2 is sized to hold sufficient liquid to completely immerse carrier 12 and wafers 14 therewithin; for efficiency in chemical use and handling, it is of course preferred that tank 2 is not greatly oversized relative to carrier 12.

The particular solvent contained within tank 2 will, of course, depend on the particular cleanup function to be performed by system 10. As noted above, it is contemplated that the present invention may be used in connection with a wide range of chemical baths, including deionized water, isopropyl alcohol, weak acid and base solutions, and the like. The liquid retained within tank 2 thus provides a chemical agent for effecting the desired cleanup.

According to this first preferred embodiment of the invention, wafer cleaning system 10 utilizes physical action in combination with the chemical action of the bath, to perform the cleaning of wafers 14. The physical action utilized by system 10 in this first preferred embodiment of the invention is a gas bubbling action, produced by the injection of an inert gas into tank 2 during such time as wafers 14 and carrier 12 are present therewithin. In the example of FIG. 1, an inert gas such as nitrogen is provided, preferably from the gas system already present within the wafer fabrication factory within which system 10 is implemented, by way of motor control valve 8 and inlet 6. Outlet baffle 5 is provided within tank 2, preferably near its bottom and beneath the location at which carrier 12 and wafers 14 will be placed, and receives inert gas from inlet 6. Baffle 5 has an array of orifices at its upper surface, as shown in FIG. 1, from which the inert gas can exit as bubbles into the chemical bath retained by tank 2. In this manner, the inert gas bubbles exiting baffle 5 are a physical agent that assists the solvent or reagent of the chemical bath in cleaning the surfaces of wafers 14 (and carrier 12).

The particular elements of the gas bubbling system illustrated in FIG. 1 are presented by way of example only. It is contemplated that the particular construction of baffle 5, including its shape, its placement, and the arrangement of orifices therein, will vary according to the construction and design of the specific cleanup system. As will be apparent from the following description, the present invention is intended to be beneficial in connection with gas bubbling systems of any design.

As shown in FIG. 1, system 10 according to this first preferred embodiment of the present invention also includes programmable controller 20, by way of which the physical action of system 10 (in this example, such physical action presented by the bubbling of inert gas injected into tank 2) is controlled. Programmable controller 20 has a signal output that is coupled to a device within system 10 that is capable of controlling and stopping the physical action. In this example, a signal output from programmable controller 20 is coupled to motor control valve 8; programmable controller 20 thus is capable of opening and closing motor control valve 8, and thus starting and stopping the physical action of the nitrogen gas bubbles within tank 2, under either user or program control.

Programmable controller 20 may be implemented by way of any conventional programmable device, system, or subsystem, by way of which manufacturing equipment and processes are controlled. For example, programmable controller 20 may be realized by way of an embedded microcontroller within system 10, which responds to user inputs or programmed sequences that are applied directly to system 10. Alternatively, programmable controller 20 may be realized within in a larger system computer implemented as a higher-performance workstation, either standalone or within a network, that controls multiple processes within the wafer fabrication factory. The particular realization of programmable controller 20 thus depends upon the desired extent and access of such control within the overall factory within which system 10 is implemented.

In any case, according to this first preferred embodiment of the invention, programmable controller 20 controls motor control valve 8 to turn on the flow of inert gas to baffle 5 to provide physical cleaning action by way of gas bubbling within tank 2 during such time as wafers 14 and carrier 12 are in place within tank 2 and, after sufficient cleaning has occurred, to turn off the flow of inert gas to baffle 5 while wafers 14 and carrier 12 are still within tank 2 and submerged in the liquid. After the gas bubbling is turned off by programmable controller 20, a brief waiting period is provided to calm the chemical bath within tank 2 and to permit any gas bubbles present within the solvent to escape to the ambient atmosphere. For gas bubbling systems such as shown in FIG. 1, the duration of this waiting period is preferably on the order of 5 to 60 seconds, depending upon the viscosity of the liquid of the chemical bath, the geometry of tank 2, and the extent to which inert gas bubbles were injected into the chemical bath during the cleaning process. Once the waiting period has elapsed, carrier 12 and wafers 14 are then removed from tank 2.

The duration of the activation of the physical action, and also the duration of the waiting period after cessation of the physical action and prior to removal of wafers 14, are preferably determined by way of experiment during process design, and implemented into the computer program under which programmable controller 20 operates. Additional observation of the performance of the cleanup may, of course, result in modifications to the program after implementation. Additionally, it is preferred that some control be provided by programmable control 20 over the withdrawal of carrier 12 and wafers 14 from tank 2, for example by way of an indicator light or sound that indicates to a human operator that the wafers may be withdrawn, or by controlling an automated lifting apparatus (not shown) to withdraw carrier 12 and wafers 14 therefrom after the waiting period. Other techniques for ensuring adherence to the waiting period will be apparent to those skilled in the art having reference to this specification.

The ability to control system 10 to turn off the physical action of the cleaning operation, according to this preferred embodiment of the invention, provides important advantages in the cleaning of integrated circuit wafers 14. Firstly, the physical action of gas bubbling significantly improves the cleaning process, not only in the efficiency of the cleanup by reducing cleanup time, but also by improving the extent to which residue is cleaned from wafers 14. Additionally, the ability of programmable controller 20 to turn off the inert gas bubbling system prior to removal of wafers 14 from tank 2 greatly reduces the risk of staining or water marking the wafers as they are withdrawn from the chemical bath, as the bubbles present in the liquid and especially at its top surface will escape from the chemical bath during the waiting period. Accordingly, the benefits of the physical action during cleanup are obtained, according to this first preferred embodiment of the invention, in a manner that reduces the risk of yield loss due to wafer staining.

Figure 2:
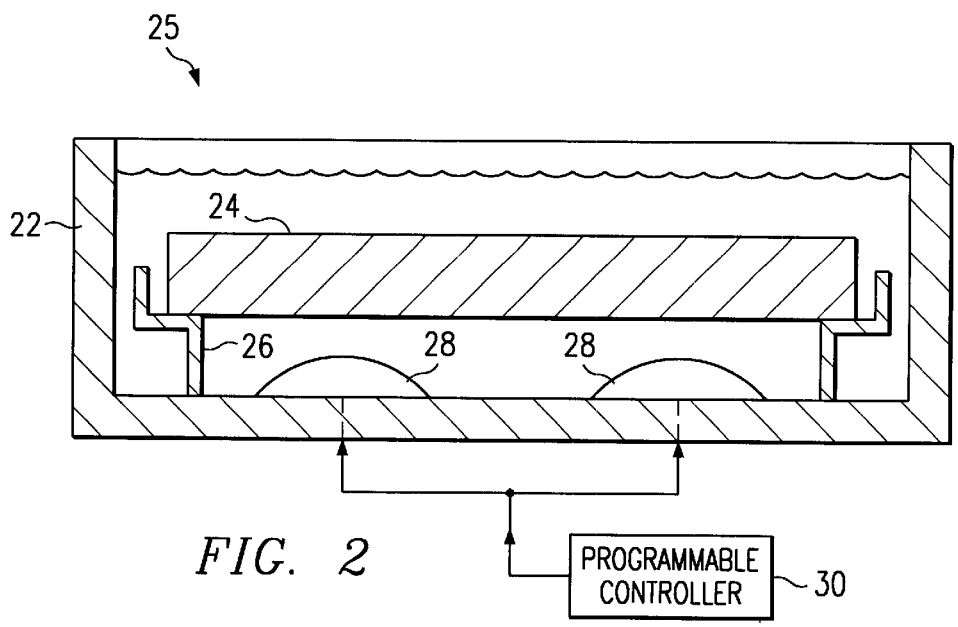
FIG. 2 is a cross-sectional view in combination with a schematic diagram, in block form, of a wafer cleaning apparatus according to a second preferred embodiment of the present invention.

Referring now to FIG. 2, the construction of wafer cleaning system 25 according to a second preferred embodiment of the present invention will now be described. System 25 in this embodiment of the invention is a single wafer cleaning system, in contrast to batch system 10 described above. As shown in FIG. 2, system 25 includes tank 22 which is sized to retain a single wafer 24. Wafer 24 is held within tank 22 by supports 26, in this example, and is oriented horizontally (i.e., flat), for efficient cleaning. Alternatively, single-wafer cleaning system 25 could be constructed to hold wafer 24 in a vertical orientation, if desired. Tank 22 also holds a sufficient amount of the chemical agent appropriate to the desired cleanup that wafer 24 is submerged as shown in FIG. 2.

In this second preferred embodiment of the invention, physical action in the cleanup is provided by way of ultrasonic energy. In this regard, ultrasonic transducers 28 are disposed within tank 22, at the bottom thereof as shown in FIG. 2. Ultrasonic transducers 28 are of conventional construction as known in the art, for receiving electrical energy and converting the same into high frequency (e.g., on the order of 800 kHz to 3 MHz) acoustic energy that is transmitted into the chemical bath within tank 22. The short wavelength waves within the chemical bath provide physical action that, in combination with the chemical properties of the solvent or reagent, effect cleaning of wafer 24 therein. The number and arrangement of transducers 28 within system 25 may be selected according to the geometry of tank 22 and the specific transducers used, for optimal cleaning effectiveness as known in the art.

According to this embodiment of the invention, ultrasonic transducers 28 are controlled by programmable controller 30, so that ultrasonic energy is imparted to the chemical bath during such time as wafer 24 is present therein, and so that the ultrasonic energy, and thus the physical cleaning action, is turned off prior to the removal of wafer 24 from tank 22. As described above, programmable controller 30 may be an embedded microcontroller dedicated to system 25, or a function of a workstation or other higher level computer in standalone or a networked arrangement, as desired for the particular factory implementation. In any event, programmable controller 30 is under user or program control so that ultrasonic transducers 28 are turned on during the cleaning of wafer 24, and then turned off. A brief waiting period, such as on the order of one to several seconds, is then permitted to elapse while wafer 24 remains within the chemical bath in tank 22; this waiting period allows the liquid of the chemical bath to calm, and any bubbles in the liquid or at its surface to escape. After the waiting period, wafer 24 may then be removed from the chemical bath, with a much reduced risk of stains or other artifacts from the chemical bath being formed on its surface.

Similarly as described above relative to the first embodiment of the present invention shown in FIG. 1, this second embodiment of the invention also provides the benefit of improved wafer cleaning through the use of both chemical and physical action upon the residue or particulates to be cleaned, while greatly reducing the likelihood that the wafer will be stained in its removal from the cleanup apparatus.

The above description of the first and second preferred embodiments of the present invention is presented by way of example only, and as such it is contemplated that various alternative realizations of the present invention may be readily derived by those skilled in the art having reference to this specification. For example, physical action may be imparted and controlled in the batch cleaning system of FIG. 1 by way of ultrasonic transducers, and gas bubbling may impart the physical action in the single wafer cleaning system of FIG. 2; still further in the alternative, both gas bubbling and ultrasonic transduction may be used in combination in either of the single wafer cleaning system or batch cleaning system. It is contemplated that these and other alternative arrangements can benefit from the present invention, in similar manner as described above.

Figure 3:
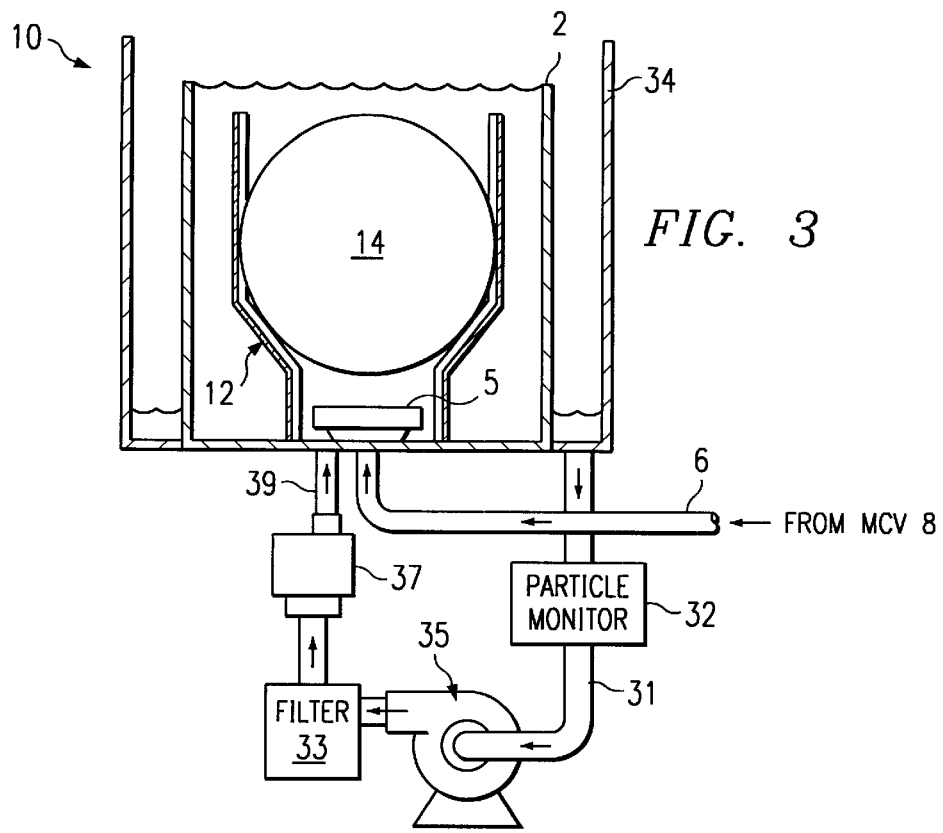
FIG. 3 is a cross-sectional view in combination with a schematic diagram, in block form, of the tank cleaning system of the wafer cleaning apparatus according to the first preferred embodiment of the present invention.

Referring now to FIG. 3, another aspect of the present invention will now be described, with reference to batch cleaning system 10 described above relative to FIG. 1 by way of example; it is to be understood, of course, that this additional aspect of the invention may also be used in connection with single wafer cleaning, and in connection with ultrasonic transducers. As shown in FIG. 3, system 10 further includes a chemical bath processing system by way of which recirculating liquid is filtered and cleaned, to remove particulates and other contaminants therefrom.

As shown in FIG. 3, tank 2 is contained within overflow tank 34, in effect operating as a weir to the liquid chemical bath. The level of liquid in tank 2 is maintained to remain at the top, slightly overflowing, so that particles from the cleanup that float to the surface are carried by the overflowing liquid into overflow tank 34. Chemical bath outlet 31 is disposed at the bottom of overflow tank 34, to receive liquid therefrom under the suction generated by pump 35. Particle monitor 32 is provided in-line between overflow tank 34 and pump 35 in this embodiment of the invention, to measure the concentration of particles in the chemical bath liquid that is drawn from tank 34. While particle monitor 32 illustrated in FIG. 3 is of the in-line type, a conventional sampling particle monitoring system may alternatively be utilized. An example of a preferred realization of particle monitor 32 is an ISPM liquid particle monitor available from Particle Measuring Systems Incorporated. Pump 35 forces the liquid through filter 33, which removes particulates present therein. The outlet of filter 33 is coupled, through control valve 37, to chemical bath inlet 39 that is in communication with tank 2, by way of which recirculated and filtered liquid is provided back into tank 2.

In operation, it is contemplated that the recirculation of liquid from tank 2 will be carried out more or less continuously, but at a relatively low flow rate, so as to not itself create turbulence or any substantial physical action in the cleaning action. This permits the physical action to be fully controlled by way of the programmable controller in the system, so that staining and other artifacts may be minimized while still obtaining the benefits of physical and chemical wafer cleaning.

According to this additional aspect of the present invention, physical action in system 10 is initiated during such time as tank 2 does not contain wafers 14. As noted above, with reference to FIG. 1, programmable controller 20 controls motor control valve 8 to turn off the flow of inert gas to baffle 5 prior to the withdrawal of wafers 14 and carrier 12 from tank 2. Prior to the submersion of the next lot of wafers 14 into tank 2, programmable controller 20 then controls motor control valve 8 to open and admit inert gas to baffle 5, restarting the physical action of gas bubbling within the chemical bath contained in tank 2. This physical action assists in the cleaning of the inner walls and bottom of tank 2 by dislodging accumulated residue and particles therefrom. Recirculation of liquid by pump 35 through filter 33 will then remove the dislodged particles from the chemical bath, preparing system 10 for the next lot of wafers 14 to be cleaned. Programmable controller 20 preferably shuts down the flow of inert gas to tank 2 prior to the immersion of the next lot, to reduce the concentration of bubbles in the chemical bath.

As noted above, the physical cleaning action applied to the tank when no wafers are present therein may alternatively be ultrasonic energy, also under the control of a programmable controller. Still further in the alternative, both ultrasonic energy and gas bubbling may be applied to the system to clean tank walls, if such are available.

Figure 4:
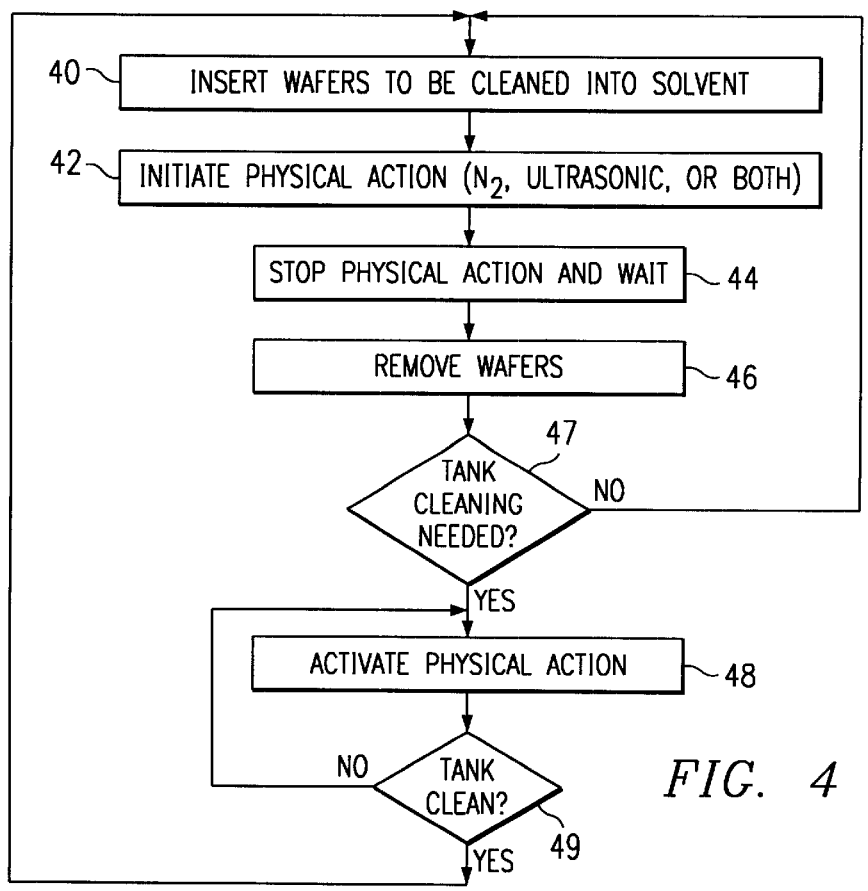
FIG. 4 is a flow diagram illustrating a method of operating a wafer cleaning apparatus according to the preferred embodiments of the present invention.

Referring now to FIG. 4, a method of cleaning integrated circuit wafers according to the preferred embodiments of the invention will now be described. The methodology illustrated in FIG. 4 may be applied to either of cleaning systems 10, 25 described above, and as such the following description will be presented as applicable to either.

Wafer cleaning begins with process 40, in which one or more wafers are immersed into the chemical bath retained by the cleaning system; of course, in single wafer cleaning system 25 described above relative to FIG. 2, a single wafer 24 will be immersed in process 40, while a lot of wafers 14 in carrier 12 will be immersed in process 40 in the case of multiple wafer cleaning system 10 described above relative to FIG. 1. As will be apparent from this description, it is preferred that process 40 be carried out with the physical action (ultrasonic or gas bubbling) turned off, to reduce the possibility of bubbles being trapped on the wafer surface.

Once wafers 14, 24 are placed into the chemical bath in process 40, chemical cleaning action will naturally begin. According to the preferred embodiment of the invention, upon wafers 14, 24 reaching a steady-state position within the chemical bath, process 42 is then performed to initiate the physical cleaning action. According to the foregoing description, process 42 is preferably carried out by programmable controller 20 controlling motor control valve 8 to admit a flow of inert gas, or by programmable controller 30 applying electrical energy to ultrasonic transducers 28 to apply ultrasonic energy to the chemical bath, or both. Process 42 is then continued for a sufficient period of time to effect the desired cleaning of the wafer or wafers in the chemical bath.

Once the desired cleaning interval has elapsed, process 44 is then performed to stop the physical action, preferably by programmable controller 20 controlling motor control valve 8 to stop the gas flow, by programmable controller 30 turning off electrical energy applied to ultrasonic transducers 28, or both, depending upon the design of the cleaning system. In the event that both ultrasonic transducers and inert gas bubbling are present within the same cleaning system, it is preferred that the associated programmable controller turn off the gas bubbling first, then the ultrasonic energy, for purposes of efficiency. Once the physical action is turned off, process 44 further inserts a wait period, as noted above, to allow for the liquid to settle and for any remaining gas bubbles to escape to the atmosphere. Following this wait period, process 46 is performed by the removal of wafers 14, 24 from the chemical bath.

As noted above, particles generated in the cleanup operation tend to float to the surface of the chemical bath liquid and, in some cases, gather upon bubbles present at the surface of the liquid. Accordingly, it may be preferable, in some applications, to repeat processes 42, 44 to generate and stop the physical action in the chemical bath within a cleaning cycle. This would permit wafers 14, 24 to first be cleaned by chemical and physical action, with the particles floating to the surface of tank 2, 22 and removed therefrom (for example by the overflow tank arrangement of FIG. 3), followed by repetition of the chemical and physical cleaning cycle of process 42 for the same wafers 14, 24, with cleaner liquid. In any event, the physical action is stopped, in process 46, after one or more passes through the cleaning process, prior to withdrawal of wafers 14, 24, as noted above.

The cleaning of tank 2, 22 with the assistance of physical action, as noted above, may be carried out after the removal of wafers 14, 24 in process 46. Decision 47 of FIG. 4 determines whether such cleaning is necessary, either by reference to a cleaning schedule (e.g., which indicates the frequency of tank cleaning), or according to a threshold particulate level sensed by particle monitor 32, or after each cleaning operation of wafers 14, 24. If tank cleaning is not desired at this point (decision 47 is NO), process 40 is repeated for the next one or more of wafers 14, 24, and the wafer cleaning operation is then repeated.

If tank cleaning is desired (decision 47 is YES), process 48 is next performed, by way of which physical action is applied to tank 2, 22 with wafers 14, 24 absent therefrom. The physical action activated in process 48 corresponds to that used in process 42 during wafer cleaning, and as such may include either gas bubbling, ultrasonic energy, or both, as desired. Preferably, the bubbling rate or ultrasonic energy applied in process 48 is optimized for the cleaning of tank 2, 22, and thus may differ from the rate or energy used in process 42 for wafer cleaning. The physical action of process 48 continues until tank 2, 22 is clean, as determined by decision 49. Decision 49 may be carried out by way of particle monitor 32 determining that the residue or particulate level within the chemical bath is below a desired threshold, or alternatively simply by a timer that continues the physical action for a preselected duration; in either case, the physical action is maintained until decision 49 determines that tank 2, 22 is sufficiently clean, at which point process 40 is repeated to begin the next wafer cleaning cycle.

According to the present invention, therefore, wafer cleaning is both improved and also made more efficient by the present invention, as the use of both chemical and physical cleaning action is enabled without the risk of staining of the wafers upon their withdrawal; the physical action not only improves the cleaning process but also can reduce the duration of the cleanup, thus improving overall manufacturing efficiency. The programmability of the wafer cleaning systems according to the present invention also enables the use of the physical action to clean the chemical bath tank in the cleanup systems, further improving the quality and efficiency of the cleanup operation, and reducing the frequency at which the chemical bath liquid must be recharged or changed.

While the present invention has been described according to its preferred embodiments, it is of course contemplated that modifications of, and alternatives to, these embodiments, such modifications and alternatives obtaining the advantages and benefits of this invention, will be apparent to those of ordinary skill in the art having reference to this specification and its drawings. It is contemplated that such modifications and alternatives are within the scope of this invention as subsequently claimed herein.

I claim:

1. A method of cleaning an integrated circuit wafer during its manufacture, comprising the steps of:

immersing at least one partially fabricated integrated circuit wafer into a chemical bath;

causing initiation and continuation of a physical action to occur against the wafer within the chemical bath to assist in the cleaning;

ceasing said causing of said continuation of said physical action;

retaining said at least one partially fabricated integrated circuit wafer in said chemical bath after substantially all of said physical action has ceased; and then removing the at least one wafer from the chemical bath after said substantially all of said physical action has ceased.

2. The method of claim 1, further comprising:

after the ceasing step, waiting for a selected time prior to the removing step.

3. The method of claim 1, further comprising:

repeating the steps of causing a physical action and ceasing the physical action before removing the at least one wafer from the chemical bath.

4. The method of claim 1, wherein the step of causing the physical action comprises:

bubbling an inert gas into the chemical bath.

5. The method of claim 1, wherein the step of causing the physical action comprises:

applying electrical energy to an ultrasonic transducer disposed within the chemical bath.

6. The method of claim 5, wherein the step of causing the physical action further comprises:

bubbling an inert gas into the chemical bath.

7. The method of claim 1, further comprising:

after the removing step, again causing the physical action while no wafer is disposed within the chemical bath.

8. The method of claim 7, wherein the chemical bath is held within a tank; and further comprising:

during the step of causing the physical action while no wafer is disposed within the chemical bath, filtering the chemical bath to remove particles therefrom.

9. The method of claim 8, further comprising:

monitoring the particle concentration in the chemical bath; and ceasing the physical action responsive to the monitored particle concentration being below a threshold.

10. The method of claim 7, further comprising:

ceasing the physical action; and then repeating the immersing, causing, ceasing, and removing steps.

11. The method of claim 1, wherein the immersing step immerses a single wafer into the chemical bath.

12. The method of claim 1, wherein the immersing step immerses a plurality of wafers and a carrier holding the plurality of wafers into the chemical bath.

* * * * *